United States Patent
Wang et al.

(10) Patent No.: US 11,496,142 B2
(45) Date of Patent: Nov. 8, 2022

(54) SIGNAL DISTRIBUTION SYSTEM, AND RELATED PHASED ARRAY RADAR SYSTEM

(71) Applicant: TRON FUTURE TECH INC., Hsinchu (TW)

(72) Inventors: Yu-Jiu Wang, Hsinchu (TW); Ta-Shun Chu, Hsinchu (TW); Yue Ming Wu, Hsinchu (TW)

(73) Assignee: TRON FUTURE TECH INC., Hsinchu (TW)

( * ) Notice: Subject to any disclaimer, the term of this patent is extended or adjusted under 35 U.S.C. 154(b) by 0 days.

(21) Appl. No.: 17/741,819

(22) Filed: May 11, 2022

(65) Prior Publication Data

US 2022/0271763 A1 Aug. 25, 2022

Related U.S. Application Data

(62) Division of application No. 16/992,786, filed on Aug. 13, 2020, now Pat. No. 11,368,161.

(Continued)

(51) Int. Cl.
*H03L 7/00* (2006.01)
*H04L 7/00* (2006.01)
(Continued)

(52) U.S. Cl.
CPC ............. *H03L 7/18* (2013.01); *H03K 23/662* (2013.01); *H03K 23/667* (2013.01); *H03L 7/24* (2013.01);
(Continued)

(58) Field of Classification Search
CPC .... H03L 7/00; H03L 7/18; H03L 7/24; H04B 7/0617; H04L 7/00; H04L 7/0008;
(Continued)

(56) References Cited

U.S. PATENT DOCUMENTS

| 4,673,892 A | 6/1987 | Miyashita et al. |
| 2004/0196203 A1* | 10/2004 | Lier ..................... H01Q 21/067 343/824 |

(Continued)

OTHER PUBLICATIONS

Taiwanese Notice of Allowance and Search Report, dated Mar. 10, 2021, for Taiwanese Application No. 109127333, with an English translation of the Taiwanese Notice of Allowance.

*Primary Examiner* — William Hernandez
(74) *Attorney, Agent, or Firm* — Birch, Stewart, Kolasch & Birch, LLP

(57) ABSTRACT

A signal distribution system includes: a first signal divider arranged to generate a first output oscillating signal according to a first input oscillating signal; a second signal divider arranged to generate a second output oscillating signal according to the first input oscillating signal; a first transmitting channel coupled to the first signal divider and the second divider for transmitting the first input oscillating signal to the first signal divider and the second signal divider; and a second transmitting channel coupled to the first signal divider and the second divider for transmitting a second input oscillating signal to the first signal divider and the second signal divider; wherein the first input oscillating signal has a first frequency, the second input oscillating signal has a second frequency, and the second frequency is smaller than the first frequency.

20 Claims, 11 Drawing Sheets

Related U.S. Application Data

(60) Provisional application No. 62/886,545, filed on Aug. 14, 2019.

(51) Int. Cl.
| | | |
|---|---|---|
| *H04W 56/00* | (2009.01) | |
| *H03L 7/18* | (2006.01) | |
| *H03K 23/66* | (2006.01) | |
| *H03L 7/24* | (2006.01) | |
| *G01S 7/02* | (2006.01) | |
| *G01S 7/295* | (2006.01) | |
| *G01S 13/34* | (2006.01) | |
| *H04B 7/06* | (2006.01) | |

(52) U.S. Cl.
CPC .............. *G01S 7/021* (2013.01); *G01S 7/295* (2013.01); *G01S 13/341* (2013.01); *H04B 7/0617* (2013.01)

(58) Field of Classification Search
CPC ... H04L 7/0016; H04L 7/0033; H04L 7/0037; H04W 56/00; H04W 56/0035; H04W 56/004
USPC .................................................. 327/115, 117
See application file for complete search history.

(56) References Cited

U.S. PATENT DOCUMENTS

| | | |
|---|---|---|
| 2009/0167441 A1 | 7/2009 | Song et al. |
| 2010/0247111 A1* | 9/2010 | Li .................... H04B 10/299 398/177 |
| 2012/0038396 A1 | 2/2012 | Shima et al. |
| 2012/0319750 A1 | 12/2012 | Zhu et al. |
| 2013/0049820 A1 | 2/2013 | Ide |
| 2013/0141146 A1 | 6/2013 | Shima |
| 2013/0278303 A1 | 10/2013 | Chen et al. |
| 2018/0083763 A1* | 3/2018 | Black .................... H04W 52/02 |

* cited by examiner

SIGNAL DISTRIBUTION SYSTEM, AND RELATED PHASED ARRAY RADAR SYSTEM

CROSS-REFERENCE TO RELATED APPLICATIONS

This application is a Divisional of co-pending U.S. patent application Ser. No. 16/992,786, filed Aug. 13, 2020, which claims the benefit of priority to U.S. Provisional Application Ser. No. 62/886,545, filed on Aug. 14, 2019; the entirety of which is incorporated herein by reference for all purposes.

BACKGROUND

A phased array antenna may be configured to form a beam to scan for the objects in the space. In order to ensure that the range and positioning accuracy of the phased array antenna, the phased array antenna is required to have a very low clock skew, which is the relative difference in time that the clock signals reach the plurality of RF transceivers of the phased array antenna. The clock skew of a phased array antenna may be deteriorated by process variations, supply voltage noise, and temperature. Therefore, providing a method to improve the clock skew of a phased array antenna is highly desirable in this field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
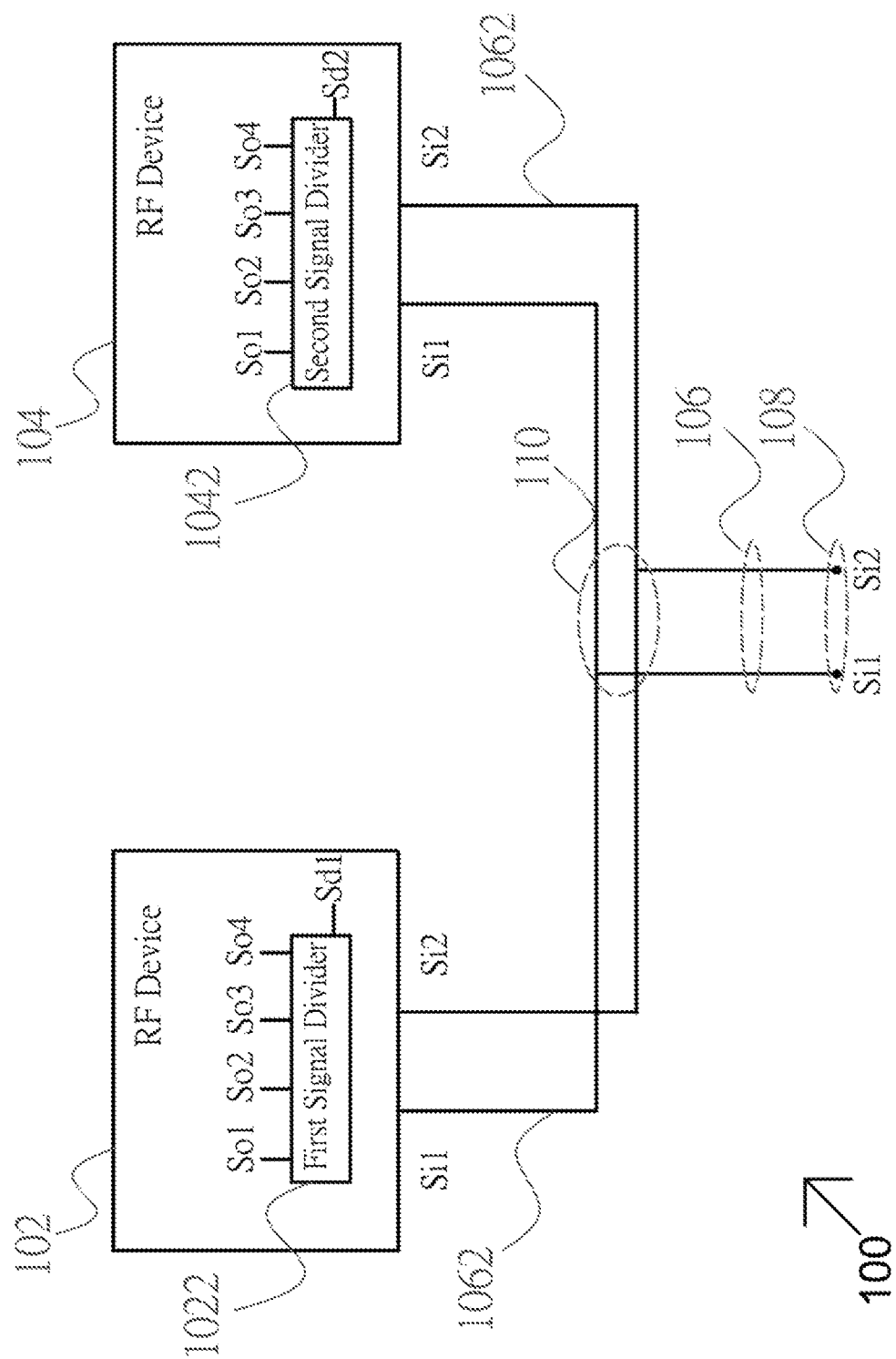
FIG. 1 is a diagram illustrating a signal distribution system accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a signal distribution system 100 accordance with some embodiments. For brevity, the signal distribution system 100 is a simplified signal distribution network merely having two radio frequency (RF) devices 102 and 104 and a signal transmission channel 106, and this is not a limitation of the present invention. In other embodiments, the signal distribution system 100 may comprises more than two RF devices and more than one signal transmission channel. For example, the signal distribution system 100 may be applied in a phased array radar system. According to the present embodiment, each of the RF devices 102 and 104 may be a transmitter, a receiver, or a transceiver. The signal transmission channel 106 is arranged to transmit a plurality of oscillating signals or clock signals to the RF devices 102 and 104. In one embodiment, the signal transmission channel 106 may be a signal bus. In another embodiment, the signal transmission channel 106 may comprise RF power divider(s), RF signal divider(s), and/or active fan-out buffer amplifier(s) to perform frequency matching and/or signal amplifying upon the transmitted high frequency signals. The signal transmission channel 106 comprises a first transmitting channel 1062 and a second transmitting channel 1064, wherein the first transmitting channel 1062 and the second transmitting channel 1064 may have the same length measured from the feed point 108 to the RF devices 102 and 104 respectively. More specifically, the first transmitting channel 1062 is arranged to transmit a first input oscillating signal Si1 to the RF devices 102 and 104, and the second transmitting channel 1064 is arranged to transmit a second input oscillating signal Si2 to the RF devices 102 and 104. The frequency of the first input oscillating signal Si1 is different from the frequency of the second input oscillating signal Si2. In order to perform frequency matching and/or signal amplifying upon the transmitted first input oscillating signal Si1 and the second input oscillating signal Si2, high frequency signals, RF power dividers, RF power dividers, and/or active fan-out buffer amplifiers may be disposed on connecting points 110 of the first transmitting channel 1062 and the second transmitting channel 1064 respectively. Therefore, the signal frequencies and/or the signal powers of the first input oscillating signal Si1 and the second input oscillating signal Si2 at the feed point 108 may be different from the signal frequencies and/or the signal powers of the first input oscillating signal Si1 and the second input oscillating signal Si2 at the RF devices 102 and 104 respectively. However, for brevity, in FIG. 1, the signal frequencies and the signal powers of the first input oscillating signal Si1 and the second input oscillating signal Si2 at the feed point 108 are equal to the signal frequencies and the signal powers of the first input oscillating signal Si1 and the second input oscillating signal Si2 at the RF devices 102 and 104 respectively.

According to the present embodiment, the RF devices 102 and 104 are arranged to emit or/and receive RF signals with a predetermined frequency. For example, the predetermined frequency may be about 9 GHz or 3 GHz. The frequencies of the first input oscillating signal Si1 and the second input oscillating signal Si2 are arranged to be different from the predetermined frequency. More specifically, the frequency of the first input oscillating signal Si1 is twice the predetermined frequency, and the frequency of the first input oscillating signal Si1 is a multiple of the frequency of the second input oscillating signal Si2. It is noted that, in some embodiments, the frequency of the first input oscillating signal Si1 may be an integer multiple of the frequency of the second input oscillating signal Si2. In some other embodiments, the frequency of the first input oscillating signal Si1 may be a fractional multiple of the frequency of the second input oscillating signal Si2. Accordingly, as shown in FIG. 1, a first signal divider 1022 and a second signal divider 1042 are further provided in the RF devices 102 and 104 for dividing the first input oscillating signals Si1 such that the RF devices 102 and 104 may emit RF signals with the predetermined frequency respectively. In this embodiment, the first signal divider 1022 is arranged to generate four output oscillating signals So1, So2, So3, and So4 with different predetermined phases (e.g., 0, 90, 180, and 270 degree) according to the first input oscillating signal Si1 and the second input oscillating signal Si2. Similarly, the second signal divider 1042 is arranged to generate another four output oscillating signals So1, So2, So3, and So4 with different predetermined phases (e.g., 0, 90, 180, and 270 degrees) according to the first input oscillating signal Si1 and the second input oscillating signal Si2. When the predetermined phases of the output oscillating signals So1, So2, So3, and So4 generated by the first signal divider 1022 and the predetermined phases of the output oscillating signals So1, So2, So3, and So4 generated by the second signal divider 1042 have the predetermined phase differences respectively, the RF devices 102 and 104 may be controlled to generate a phase shifted RF signal for scanning objects in different directions. For example, the output oscillating signal So1 generated by the first signal divider 1022 and the output oscillating signal So1 generated by the second signal divider 1042 may be adjusted to have a first fixed phase difference, the output oscillating signal So2 generated by the first signal divider 1022 and the output oscillating signal So2 generated by the second signal divider 1042 may be adjusted to have a second fixed phase difference, and first fixed phase difference is equal to the second fixed phase difference. Then, the output oscillating signals So1, So2, So3, and So4 generated by the first signal divider 1022 (as well as the second signal divider 1042) are provided to a mixer for up-converting an outputting signal or down-converting a receiving signal.

However, the signal transmission channel 106 may cause clock skew among the input oscillating signals Si1 and Si2, which may subsequently affect the phases of the output oscillating signal So1 (as well as So2, So3, and So4). In order to guarantee the output oscillating signal So1 (as well as So2, So3, and So4) generated by the first signal divider 1022 are synchronous with the output oscillating signal So1 (as well as So2, So3, and So4) generated by the second signal divider 1042, during the operation mode of the signal distribution system 100, the first signal divider 1022 and the second signal divider 1042 are further arranged to generate a first detecting signal Sd1 and a second detecting signal Sd2 to a computing device (not shown) respectively. According to the present embodiment, the computing device is arranged to determine if the output oscillating signal So1 generated by the first signal divider 1022 is synchronous with the output oscillating signal So1 generated by the second signal divider 1042 based on the voltage levels of the first detecting signal Sd1 and the second detecting signal Sd2. For example, when the voltage levels of the first detecting signal Sd1 and the second detecting signal Sd2 are different, the computing device determines that the output oscillating signal So1 generated by the first signal divider 1022 is not the same phase as the output oscillating signal So1 generated by the second signal divider 1042, e.g. the phase difference between the output oscillating signal So1 generated by the first signal divider 1022 and the output oscillating signal So1 generated by the second signal divider 1042 is 180 degree. When the voltage levels of the first detecting signal Sd1 and the second detecting signal Sd2 are the same (e.g. the high voltage level Vdd or the low voltage level Vgnd), the computing device determines that the output oscillating signal So1 generated by the first signal divider 1022 is the same phase as the output oscillating signal So1 generated by the second signal divider 1042. In addition, when the computing device determines that the phase of the output oscillating signal So1 generated by the first signal divider 1022 and the phase of the output oscillating signal So1 generated by the second signal divider 1042 are different, one of the first signal divider 1022 and the second signal divider 1042 may be adjusted to change the phase of the corresponding output oscillating signal in order to make the output oscillating signal So1 and the phase of the output oscillating signal So1 to have the same phase. The detailed adjusting operation is described in the later paragraphs.

Figure 2:
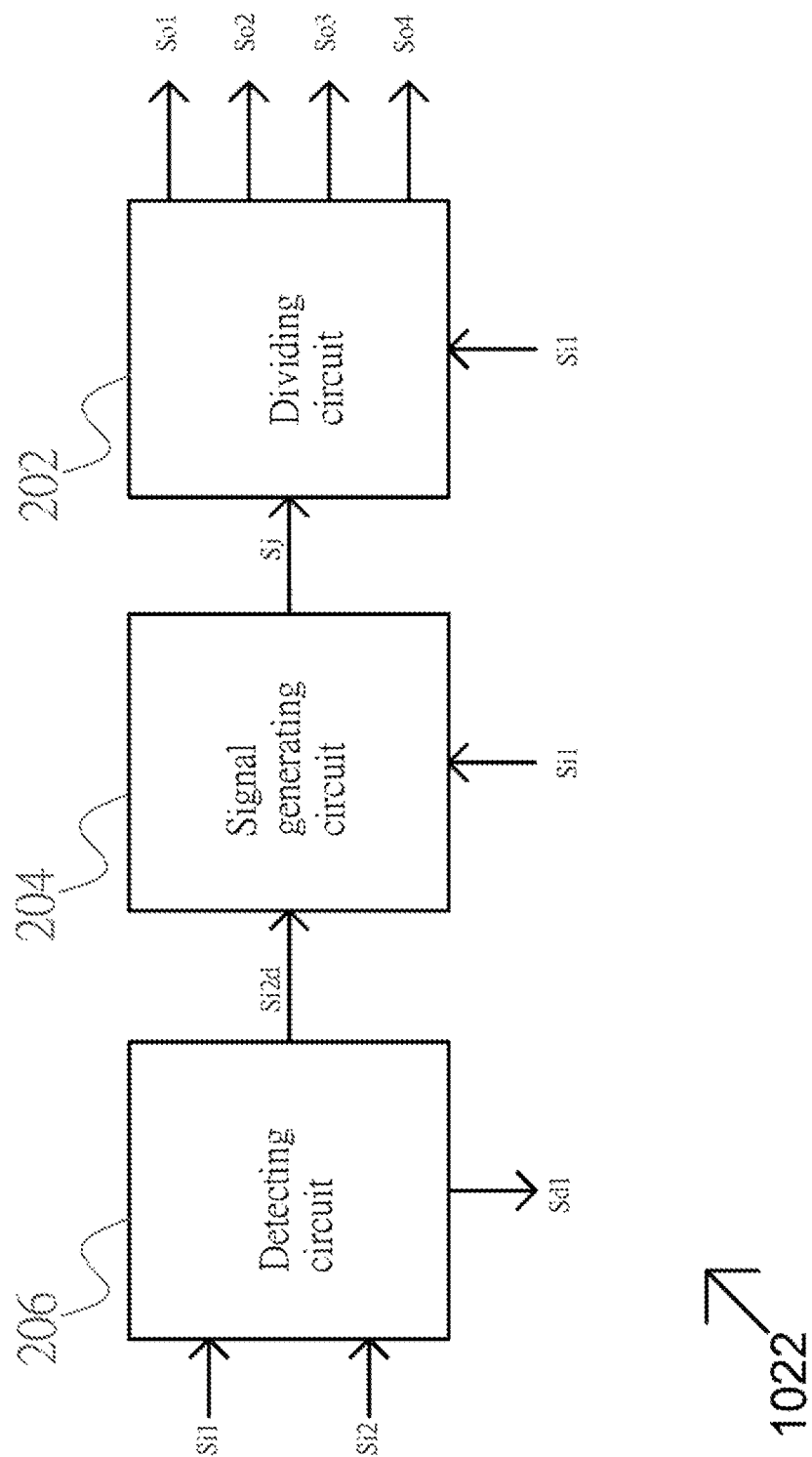
FIG. 2 is diagram illustrating a signal divider in accordance with some embodiment.

According to the present embodiment, the configuration of the first signal divider 1022 is similar to the configuration of the second signal divider 1042. For brevity, FIG. 2 is diagram illustrating the first signal divider 1022 in accordance with some embodiment. The signal divider 1022 comprises a dividing circuit 202, a signal generating circuit 204, and a detecting circuit 206. According to some embodiments, the dividing circuit 202 is arranged to generate a plurality output oscillating signals So1, So2, So3, and So4 according to the first input oscillating signal Si1 and an injection signal Sj. The signal divider 1022 may be configured to be a current mode logic (CIVIL) or current steering quadrature divider. The signal generating circuit 204 is coupled to the dividing circuit 202 for generating the injection signal Sj according to the first input oscillating signal Si1 and the second input oscillating signal Si2. The detecting circuit 206 is coupled to the dividing circuit 202 and the signal generating circuit 204 for generating the detecting signal Sd1 according to a first phase of the first input oscillating signal Si1 and a second phase of the second input oscillating signal Si2. According to the present embodiment, by using the injection signal Sj, the dividing circuit 202 is capable of outputting the output oscillating signals So1~So4 with four predetermined phases respectively. For example, the injection signal Sj is a pulse signal with a predetermined pulse width, and when the pulse signal of injection signal Sj triggers the dividing circuit 202, the phase of the output oscillating signals So1~So4 may force to be 0, 90, 180, and 270 degrees respectively. More specifically, for the example of the output oscillating signal So1, when the pulse signal of injection signal Sj triggers the dividing circuit 202, the voltage level of the output oscillating signal So1 may be pulled to the reference voltage (e.g. the supply voltage Vdd) of the dividing circuit 202 such that the phase of the output oscillating signal So1 is outputted as 0 degree. When the phase of the output oscillating signal So1 is 0 degree, the phases of the output oscillating signals So2~So4 may be 90, 180, and 270 degrees respectively.

Figure 3:
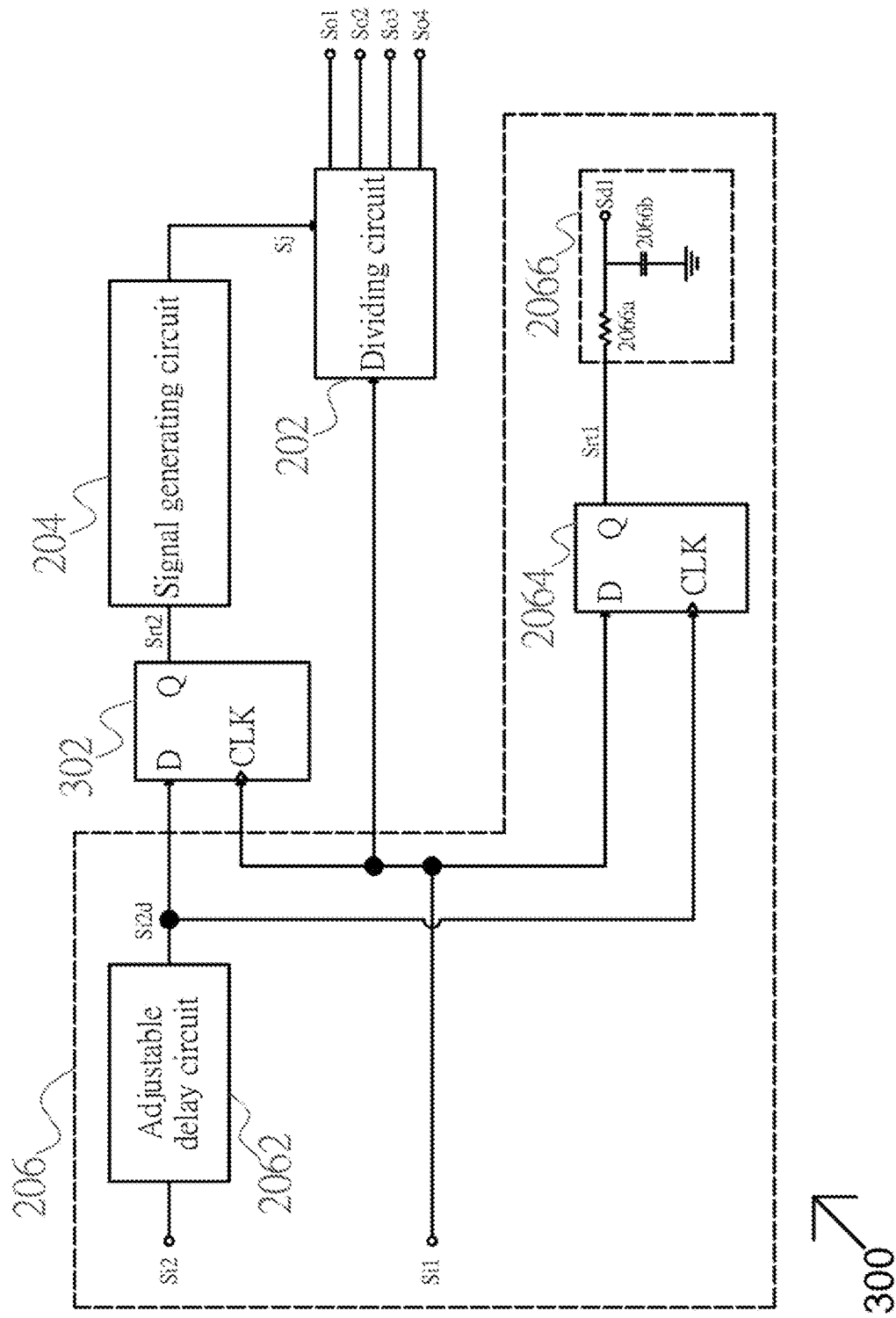
FIG. 3 is a diagram illustrating another signal divider in accordance with some embodiment.

FIG. 3 is a diagram illustrating a signal divider 300 in accordance with some embodiment. The signal divider 300 is the first signal divider 1022 as well as the second signal divider 1042 in more detail. The detecting circuit 206 comprises an adjustable delay circuit 2062, a first flip-flop circuit 2064, and a low-pass filter 2066. The adjustable delay circuit 2062 is coupled to the signal generating circuit 204 for delaying the input oscillating signal Si2 by a delay time to generate the delayed oscillating signal Si2$d$. The adjustable delay circuit 2062 may be configured to be a current mode logic (CML) or current steering delay line. The first flip-flop circuit 2064 may be configured to be a D-type flip-flop. The flip-flop circuit 2064 has a data input terminal D receiving the input oscillating signal Si1, a clock input terminal CLK coupled to the adjustable delay circuit 2062 for receiving the delayed oscillating signal Si2$d$, and a data output terminal Q for generating a first retiming oscillating signal Srt1. The low-pass filter 2066 is coupled to the data output terminal Q for outputting the detecting signal Sd1 according to the first retiming oscillating signal Srt1. The low-pass filter 2066 comprises a resistor 2066$a$ and a capacitor 2066$b$. The resistor 2066$a$ has a first terminal coupled to the data output terminal Q of the flip-flop circuit 2064 and a second terminal outputting the detecting signal Sd1. The capacitor 2066$b$ has a terminal coupled to the second terminal of the resistor 2066$a$, and a second terminal coupled to a reference voltage level, e.g. the ground voltage Vgnd.

According to the present embodiment, the signal divider 300 further comprises a second flip-flop circuit 302. The flip-flop circuit 302 may be configured to be a D-type flip-flop. The flip-flop circuit 302 having a data input terminal D coupled to the adjustable delay circuit 2062 for receiving the delayed oscillating signal Si2$d$, a clock input terminal CLK for receiving the first input oscillating signal Si1, and a data output terminal Q coupled to the signal generating circuit 204 for generating a second retiming oscillating signal Srt2, wherein the signal generating circuit 204 is arranged to generate the injection signal Sj according to the second retiming oscillating signal Srt2.

During the operation of the signal divider 300, the dividing circuit 202 is arranged to divide the input oscillating signal Si1 such that the oscillating frequency of the output oscillating signal So1 (as well as So2, So3, and So4) is a half of the oscillating frequency of the input oscillating signal Si1. For a conventional divider, the phase of the output oscillating signal generated by the conventional divider may be randomly fixed to 0 degree or 180 degree, and this characteristic may cause problem during the phase-shifting operation of a phased array radar system. To overcome this problem, according to the present embodiment, the injection signal Sj is applied to pull the voltage level of the output oscillating signal So1 to one of the reference voltages (e.g. the supply voltage Vdd or the ground voltage Vgnd) of the dividing circuit 202 such that the voltage level of the output oscillating signal So1 is fixed or changed to the predetermine voltage level for a short period (e.g. the pulse width of the injection signal Sj) when the injection signal Sj is enabled. By doing this, the phase of the output oscillating signal So1 may always be locked to the predetermined phase (e.g. 0 or 180 degree) when the injection signal Sj is enabled.

According to the present embodiment, the injection signal Sj is generated by the signal generating circuit 204 according to the first input oscillating signal Si1 and the second input oscillating signal Si2. More specifically, when the first input oscillating signal Si1 and the second input oscillating signal Si2 reach the signal divider 300, the flip-flop circuit 2064 and the low-pass filter 2066 are arranged to generate the detecting signal Sd1 according to the first input oscillating signal Si1 and the delayed oscillating signal Si2$d$ (or the second input oscillating signal Si2 if the delay time of the adjustable delay circuit 2062 is zero). The flip-flop circuit 2064 is arranged to retime the first input oscillating signal Si1 to generate the first retiming oscillating signal Srt1 by using the delayed oscillating signal Si2$d$. The low-pass filter 2066 is arranged to low-pass the first retiming oscillating signal Srt1 to generate the detecting signal Sd1. Then, a computing device (not shown), which is coupled to the detecting circuit 206, is arranged detect the voltage level of the detecting signal Sd1 to determine if the delayed oscillating signal Si2$d$ is locked to the predetermined phase of the first input oscillating signal Si1. When the delayed oscillating signal Si2$d$ fails to lock or align to the predetermined phase of the first input oscillating signal Si1, the delay time of the adjustable delay circuit 2062 may be adjusted by the computing device for generating the delayed oscillating signal Si2d by delaying the second input oscillating signal Si2. The adjustable delay circuit 2062 may be adjusted until the phase of the delayed oscillating signal Si2d is locked to the predetermined phase of the first input oscillating signal Si1.

Figure 4:
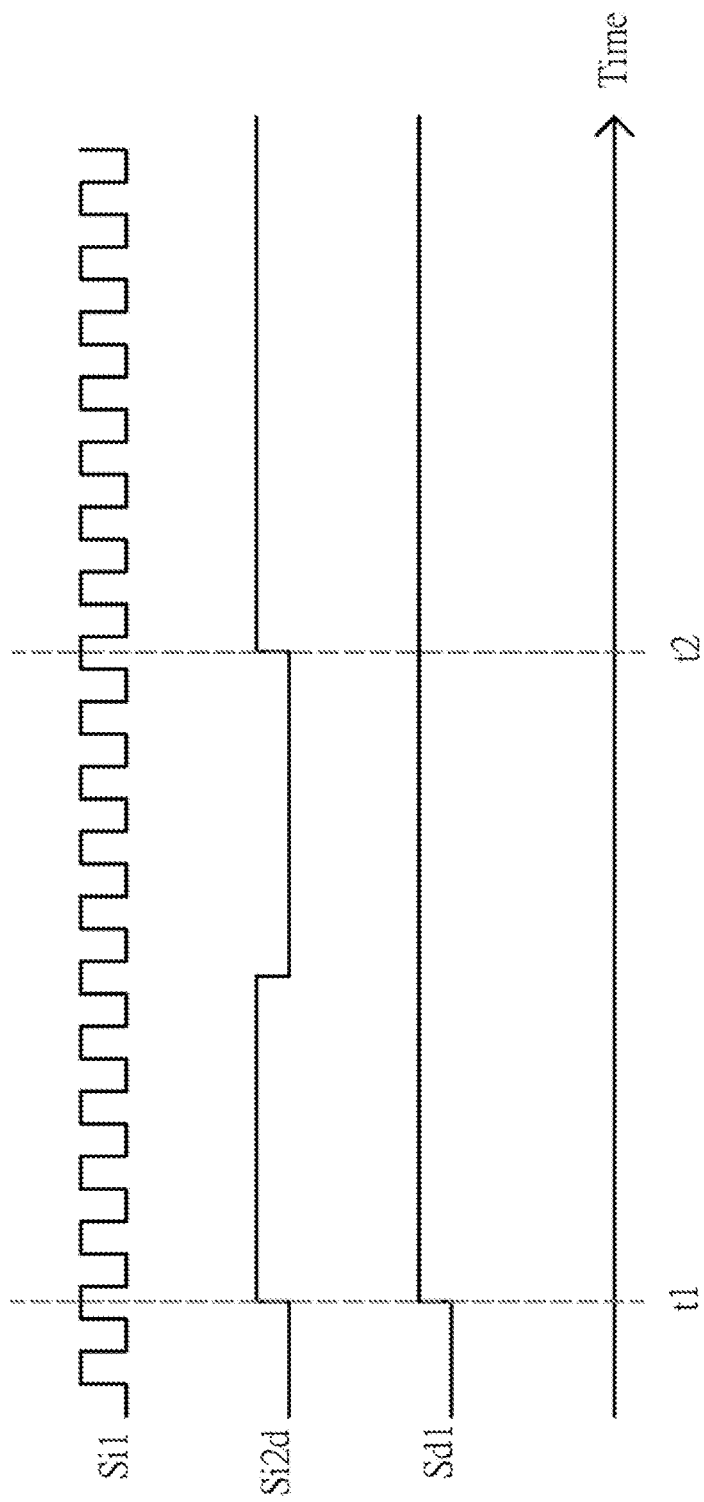
FIG. 4 is a timing diagram illustrating an input oscillating signals, a delayed oscillating signal, and a detecting signal in accordance with some embodiments.
Figure 5:
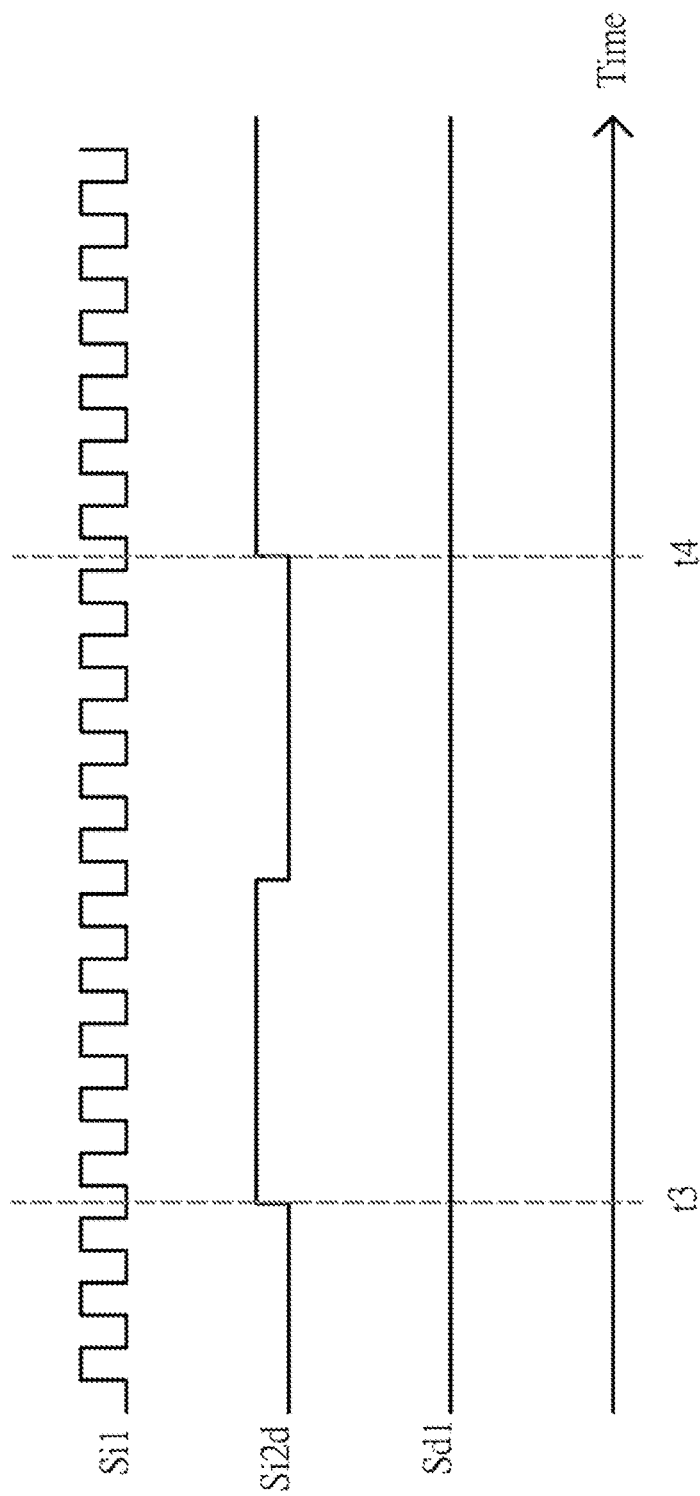
FIG. 5 is a timing diagram illustrating an input oscillating signal, a delayed oscillating signal, and a detecting signal in accordance with some embodiments.

For example, when the voltage level of the detecting signal Sd1 is the high voltage level (e.g. the supply voltage Vdd), the computing device determines that the rising edge of the delayed oscillating signal Si2d is locked to the high voltage level of the first input oscillating signal Si1 as shown in FIG. 4. FIG. 4 is a timing diagram illustrating the input oscillating signals Si1, the delayed oscillating signal Si2d, and the detecting signal Sd1 in accordance with some embodiments. In this embodiment, the rising edges (e.g. the time t1 and t2) of the delayed oscillating signal Si2d is always locked to the high voltage level of the first input oscillating signal Si1. Therefore, the voltage level of the detecting signal Sd1 may be kept on the high voltage level. If the current phase of the delayed oscillating signal Si2d is not locked to the predetermined phase of the first input oscillating signal Si1, the computing device may just delay the delay time of the adjustable delay circuit 2062 for about a half of the period of the first input oscillating signal Si1 to make the phase of the delayed oscillating signal Si2d is locked to the desired phase of the first input oscillating signal Si1 as shown in FIG. 5. FIG. 5 is a timing diagram illustrating the input oscillating signal Si1, the delayed oscillating signal Si2d, and the detecting signal Sd1 in accordance with some embodiments. In this embodiment, the rising edges (e.g. the time t3 and t4) of the delayed oscillating signal Si2d is always locked to the low voltage level of the first input oscillating signal Si1. Therefore, the voltage level of the detecting signal Sd1 may be changed to or kept on the low voltage level.

It is noted that when the voltage level of the detecting signal Sd1 is in between or oscillated between the ground voltage Vgnd and the supply voltage Vdd (e.g. a half of the supply voltage Vdd), the computing device determines that the rising edge of the delayed oscillating signal Si2d is aligned to the rising edge or falling edge of the first input oscillating signal Si1. In this situation, the computing device may just delay the delay time of the adjustable delay circuit 2062 for about a quarter or three quarters of the period of the first input oscillating signal Si1 to make the rising edge of the delayed oscillating signal Si2d to lock to the high voltage level or the low voltage level of the first input oscillating signal Si1. The detailed description is omitted here for brevity.

According to the present embodiment, the computing device is coupled to the adjustable delay circuit 2062 and the low-pass filter 2066. The computing device may be an internal device or an external device of the signal divider 300. The computing device is further arranged to automatically generate an optimal delay time for the adjustable delay circuit 2062 when the signal distribution system 100 is booted. The computing device may also be regarded as a loop back path for automatically calibrating the delay time of the adjustable delay circuit 2062. The computing device may be implemented in the form of microcontroller (MCU), or logical device (e.g. Field Programmable Gate Array, FPGA). More specifically, during the booting process of the signal distribution system 100, the computing device is arranged to sweep the delay times of the adjustable delay circuit 2062 control the adjustable delay circuit 2062 to generate a plurality of testing oscillating signals (i.e. Si2d) according to different testing delay times respectively. Meanwhile, the computing device may detect the detecting signals (i.e. Sd1) corresponding to the testing delay times respectively. Then, the computing device may select or determine a delay time from the testing delay times to be the optimal delay time for the adjustable delay circuit 2062 according to the plurality of corresponding detecting signals. By using the optimal delay time, the signal divider (e.g. 300) may have the largest margin to tolerate the shifting between the first input oscillating signal Si1 and the second input oscillating signal Si2.

Figure 6A:
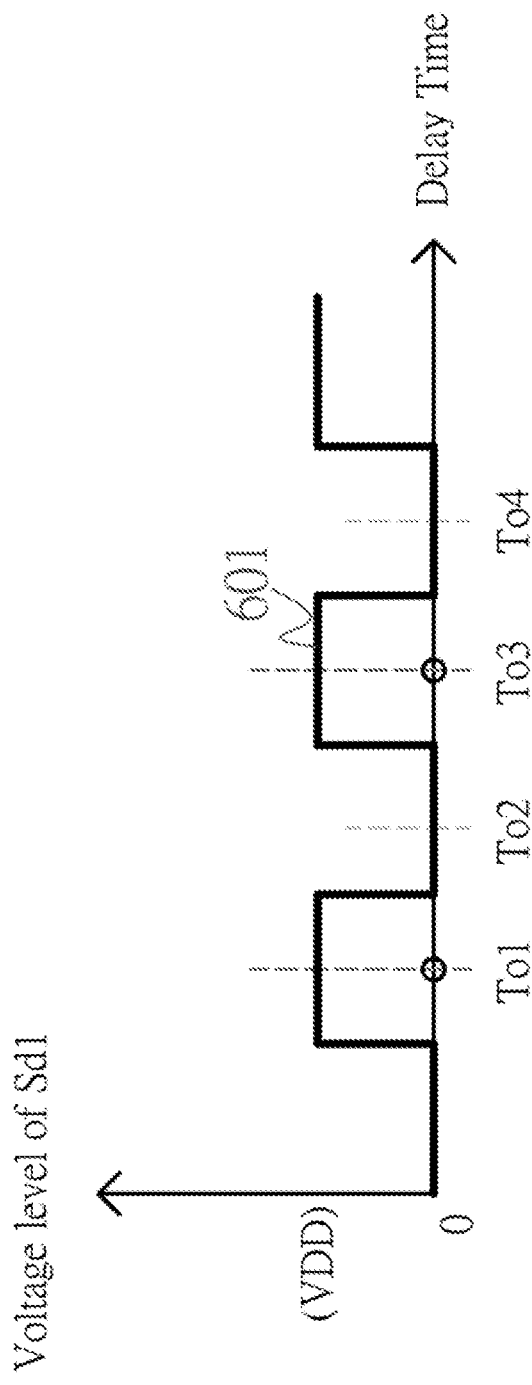
FIG. 6A is a diagram illustrating the variation of a detecting signal with respect to the delay times of an adjustable delay circuit in accordance with some embodiments.

FIG. 6A is a diagram illustrating the variation of the voltage level of the detecting signal Sd1 with respect to the delay times of the adjustable delay circuit 2062 in accordance with some embodiments. During the booting process, for a signal divider (e.g. 300), the computing device may detect and record the voltage levels of the detecting signals (i.e. Sd1) corresponding to the different delay times of the adjustable delay circuit 2062 respectively. Then, the curve 601 may be obtained by the computing device. If the high voltage level is the desired voltage level of the detecting signal Sd1, then the optimal delay time (e.g. To1 or To3) of the adjustable delay circuit 2062 is the delay time located at about the center of the high voltage area of the curve 601. If the low voltage level is the desired voltage level of the detecting signal Sd1, then the optimal delay time (e.g. To2 or To4) of the adjustable delay circuit 2062 is the delay time located at about the center of the low voltage area of the curve 601. Accordingly, by repeating the above operation during the booting process, the optimal delay times off all the signal dividers in the signal distribution system 100 may be obtained.

Meanwhile, during the operation of the signal divider 300, the flip-flop circuit 302 is arranged to retime the delayed oscillating signal Si2d to generate the second retiming oscillating signal Srt2 by using the first input oscillating signal Si1 such that the second retiming oscillating signal Srt2 is synchronous with the first input oscillating signal Si1. According to some embodiment, the oscillating frequency or the waveform of the second retiming oscillating signal Srt2 is similar the delayed oscillating signal Si2d, thus the detailed description is omitted here for brevity.

When the second retiming oscillating signal Srt2 is synchronous with the first input oscillating signal Si1, the signal generating circuit 204 is arranged to generate the pulse signal (i.e. injection signal Sj) according to the second retiming oscillating signal Srt2. The pulse signal is applied to pull the voltage level of the output oscillating signal So1 to the supply voltage Vdd (for example) for a short period (e.g. the pulse width of the pulse signal) when the injection signal Sj is enabled.

According to some embodiments, the period of the pulse signal is similar to the period of the second retiming oscillating signal Srt2. However, this is not a limitation of the present invention. the period of the pulse signal may be longer than the period of the second retiming oscillating signal Srt2, e.g. a multiple of the period of the second retiming oscillating signal Srt2.

Figure 6B:
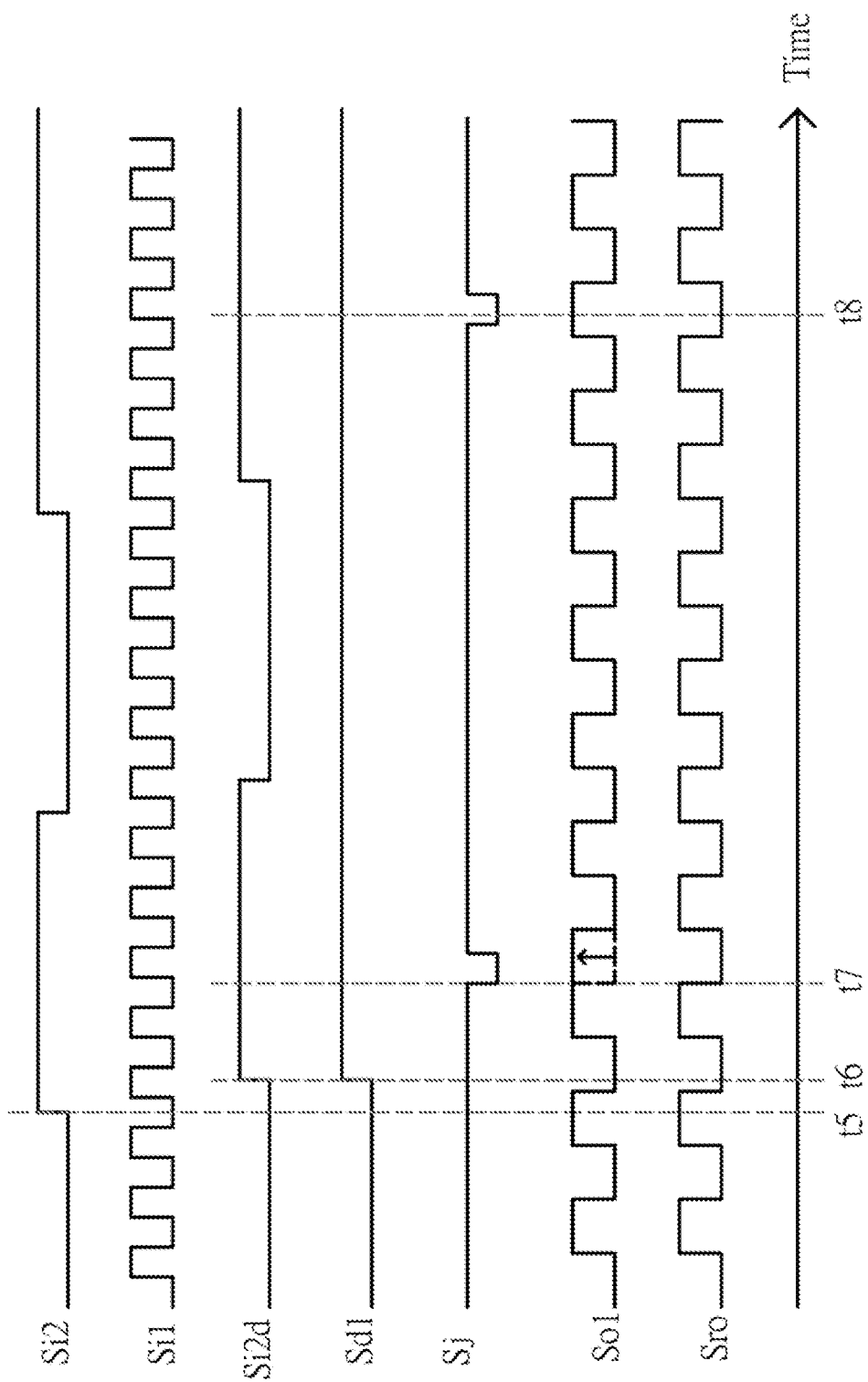
FIG. 6B is a timing diagram illustrating input oscillating signals, a delayed oscillating signal, a detecting signal, an injection signal, an output oscillating signal, and a reference output oscillating signal in accordance with some embodiments.

FIG. 6B is a timing diagram illustrating the input oscillating signals Si1, Si2, the delayed oscillating signal Si2d, the detecting signal Sd1, the injection signal Sj, the output oscillating signal So1, and a reference output oscillating signal Sro in accordance with some embodiments. The reference output oscillating signal Sro is shown in FIG. 6B for providing a reference phase for the output oscillating signal So1. Moreover, FIG. 6B merely shows the phase adjustment of the output oscillating signal So1, and the phases of the output oscillating signals So2~So4 are omitted here for brevity. At time t5, the input oscillating signals Si1 and Si2 reach the signal divider 300, and the rising edge of the input oscillating signal Si2 is locked to the low voltage level of the input oscillating signal Si1. It is assumed that the rising edge of the input oscillating signal Si2 should be locked to the high voltage level of the input oscillating signal Si1, which means that the input oscillating signal Si2 should be adjusted by the adjustable delay circuit 2062. Then, the adjustable delay circuit 2062 is adjusted to delay the input oscillating signal Si2 to generate the delayed oscillating signal Si2d. At time t6, the voltage level of the detecting signal Sd1 is changed to the high voltage level from the low voltage level. Therefore, the computing device determines that the rising edge of the delayed oscillating signal Si2d is locked to the high voltage level of the input oscillating signal Si1 at time t6.

Then, at time t7, a pulse signal (i.e. Sj) is generated by the signal generating circuit 204. In this embodiment, the falling edge of the pulse signal at time t7 may cause the voltage level of the output oscillating signal So1 to keep on the high voltage level at time t7, in which the voltage level of the output oscillating signal So1 may be changed to the low voltage level if the signal generating circuit 204 is absent. The reference output oscillating signal Sro is the output oscillating signal generated by the dividing circuit 202 when the signal generating circuit 204 is absent. It can be seen that the phase of the output oscillating signal So1 is 180 degree different from the phase of the reference output oscillating signal Sro by injecting the pulse signal to the dividing circuit 202.

In addition, when the falling edge of the pulse signal is locked to the high voltage level of the output oscillating signal So1, the dividing circuit 202 may keep the voltage level of the output oscillating signal So1 on the current voltage level as shown in the time t8 of FIG. 6B. In time t8, the falling edge of the pulse signal is locked to the high voltage level of the output oscillating signal So1, and the phase of the output oscillating signal So1 may not be changed. Accordingly, by using the present signal generating circuit 204 to inject the pulse signal to the dividing circuit 202, the pulse signal may correct or calibrate the phase of the output oscillating signal So1 if the phase of the output oscillating signal So1 deviates or shifts from the predetermined phase, and the pulse signal may not change the phase of the output oscillating signal So1 if the phase of the output oscillating signal So1 is in the predetermined phase.

Figure 7:
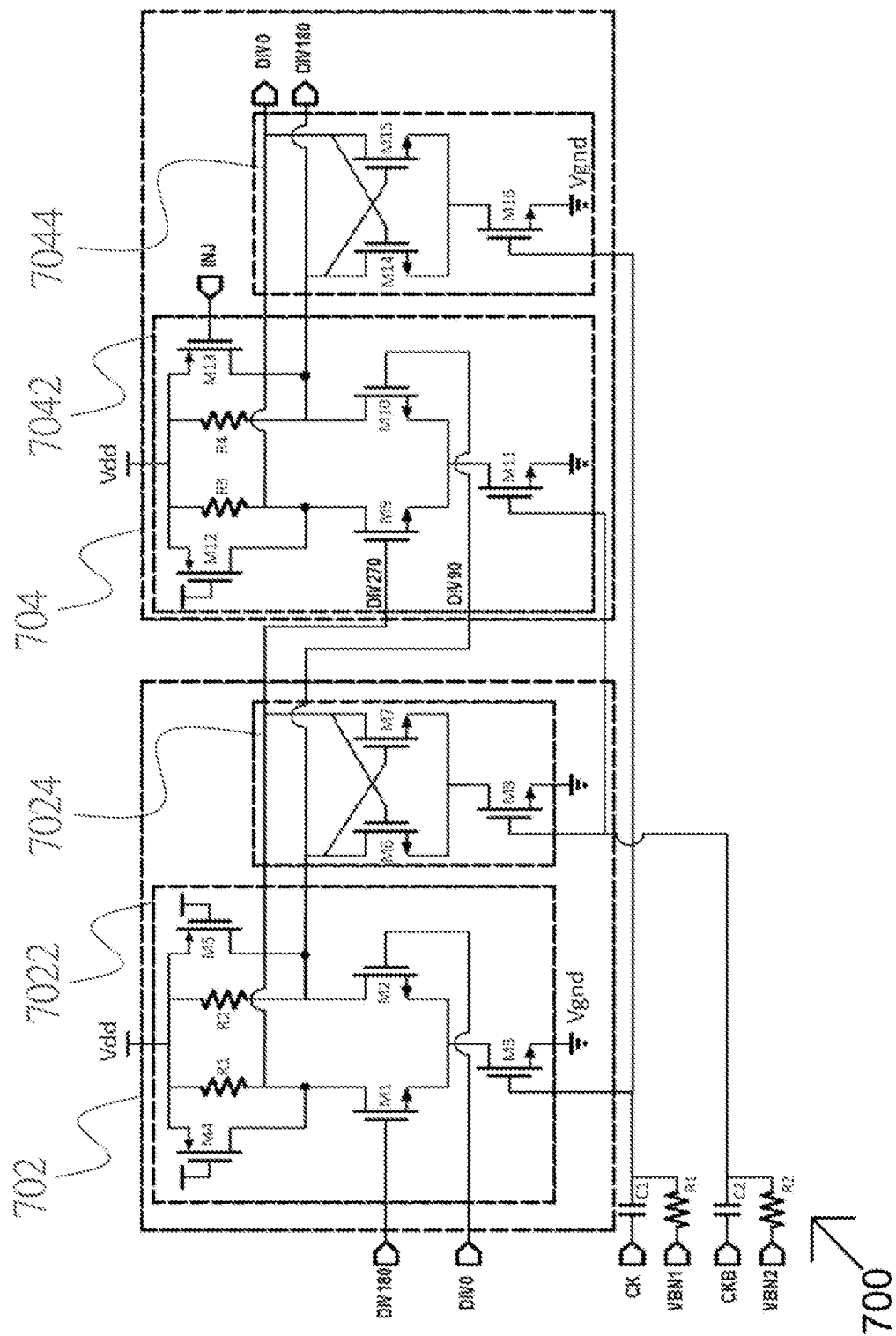
FIG. 7 is a schematic diagram illustrating a dividing circuit in accordance with some embodiments.

FIG. 7 is a schematic diagram illustrating a dividing circuit 700 in accordance with some embodiments. The dividing circuit 700 may be a schematic implementation of the dividing circuit 202. The dividing circuit 700 comprises a first latch 702 and a second latch 704. The first latch 702 and the second latch 704 may be CML latches, and the signals of the first latch 702 and the second latch 704 may be configured in the form of negative feedback such that the oscillating frequency of the output clock is a half of the oscillating frequency of the input clock. More specifically, the first latch 702 comprises an input stage 7022 and an output stage 7024, the input stage 7022 is controlled by an input clock signal CK, and the output stage 7024 is controlled by an inversed signal (i.e. the inversed clock signal CKB) of the input clock signal CK. The second latch 704 comprises an input stage 7042 and an output stage 7044, the input stage 7042 is controlled by the inversed clock signal CKB, and the output stage 7044 is controlled by the input clock signal CK.

In addition, the input stage 7022 comprises a first input terminal (i.e. DIV180) and a second input terminal (i.e. DIV0), and a first output terminal (i.e. DIV270) and a second output terminal (i.e. DIV90) coupled to the output stage 7024. The input stage 7042 comprises a first input terminal (i.e. DIV270) and a second input terminal (i.e. DIV90), and a first output terminal (i.e. DIV0) and a second output terminal (i.e. DIV180) coupled to the output stage 7044. As shown in FIG. 7, the first input terminal (i.e. DIV180) and the second input terminal (i.e. DIV0) of the first latch 702 are coupled to the second output terminal (i.e. DIV180) and the first output terminal (i.e. DIV0) of the second latch 704 respectively, and the first output terminal (i.e. DIV270) and the second output terminal (i.e. DIV90) of the first latch 702 are coupled to the first input terminal (i.e. DIV270) and the second input terminal (i.e. DIV90) of the second latch 704 respectively. According to the embodiment, an injection signal INJ is inputted to the second output terminal (i.e. DIV180) of the second latch 704. However, this is not a limitation of the present invention. In other embodiments, the injection signal INJ may be inputted to any of the output terminals (i.e. DIV270, DIV90, DIV0) of the dividing circuit 700.

According to some embodiments, the input stage 7022 comprises a plurality of transistor M1~M5 and a plurality of resistor R1~R2, and the output stage 7024 comprises a plurality of transistor M6~M8. The input stage 7042 comprises a plurality of transistor M9~M13 and a plurality of resistor R3~R4, and the output stage 7044 comprises a plurality of transistor M14~M16. The transistors M1~M3, M6~M11, and M14~M16 are n-type field effected transistors, and the transistors M4~M5 and M12~M3 are p-type field effected transistors. However, this is not a limitation of the present invention. In other embodiments, the transistors M1~M3, M6~M11, and M14~M16 may be p-type field effected transistors, and the transistors M4~M5 and M12~M3 may be n-type field effected transistors.

In this embodiment, the gate and the source of the transistor M4 are coupled to the supply voltage Vdd, and the drain of the transistor M4 is coupled to the drain of the transistor M1. The gate and the source of the transistor M5 are coupled to the supply voltage Vdd, and the drain of the transistor M5 is coupled to the drain of the transistor M2. The gate and the source of the transistor M12 are coupled to the supply voltage Vdd, and the drain of the transistor M12 is coupled to the drain of the transistor M9. The gate of the transistor M13 is coupled to the injection signal INJ, the source of the transistor M13 is coupled to the supply voltage Vdd, and the drain of the transistor M13 is coupled to the drain of the transistor M10. The detailed connectivity among the elements in the dividing circuit 700 is shown in FIG. 7, and the detailed description is omitted here for brevity.

In this embodiment, the transistor M12 is configured to be a dummy transistor, which is used for providing the similar electrical characteristic or loading at the terminal DIV0 as the terminal DIV180. Similarly, the transistors M4 and M5 are configured to be the dummy transistors, which are used for providing the similar electrical characteristics or loadings at the terminals DIV270 and DIV90 as the terminals DIV0 and DIV180 respectively.

According to the present embodiment, the input clock signal CK in combination with the inversed clock signal CKB may be the first input oscillating signal Si1, which is a differential oscillating signal, of FIG. 3. The injection signal INJ may be the injection signal Sj of FIG. 3. When the pulse signal of the injection signal INJ reaches the gate of the transistor M13 (e.g. at the time t7 of FIG. 6B), the falling edge of the pulse signal may turn on the transistor M13, and the voltage level at the drain terminal (i.e. DIV180) may be pulled into the high voltage level (e.g. the supply voltage Vdd). When the voltage level of the pulse signal is changed into the high voltage level (e.g. the supply voltage Vdd) from the low voltage level (e.g. the ground voltage Vgnd), the transistor M13 may be turned off, and the latch 702 in combination with the latch 704 may continue to generate the oscillating signal (e.g. So1) at the terminal DIV180 with the new phase.

Moreover, the input clock signal CK and the inversed clock signal CKB are coupled to the gates of transistors M3 and M16 and the gates of transistors M8 and M11 of the first latch 702 and the second latch 704 through capacitors C1 and C2 respectively, which are used to transmit the AC signals of the input clock signal CK and the inversed clock signal CKB to the first latch 702 and the second latch 704 respectively. The gates of transistors M3 and M16 are biased by a bias voltage VBN1 through a resistor R1, and the gates of transistors M8 and M11 are biased by another bias voltage VBN2 through a resistor R2.

Figure 8:
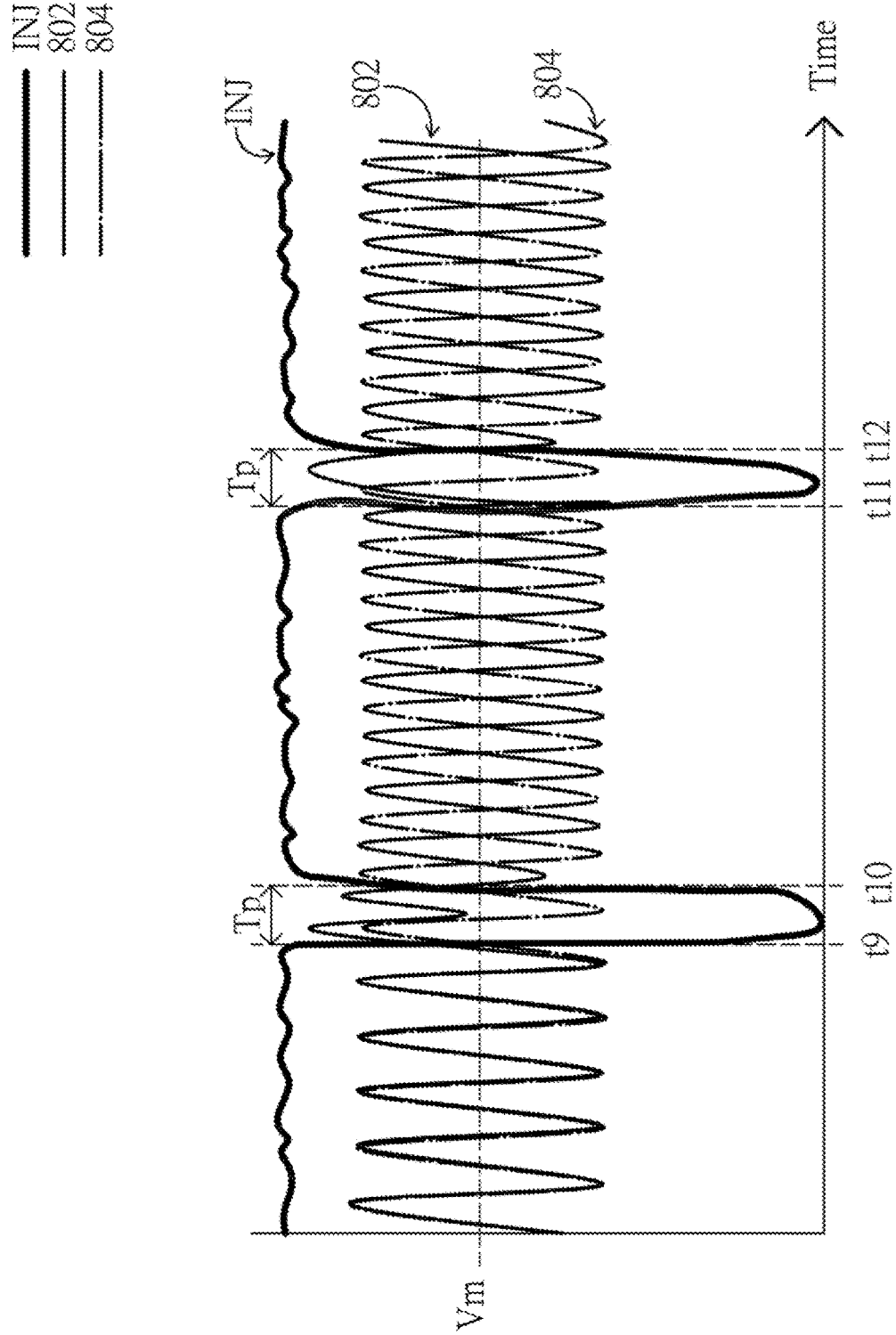
FIG. 8 is a timing diagram illustrating the waveforms of an oscillating signal, an injection signal, and a reference oscillating signal in accordance with some embodiments.

FIG. 8 is a timing diagram illustrating the waveforms of the oscillating signal at the terminal DIV180 (i.e. 802), the injection signal INJ, and a reference oscillating signal at the terminal DIV180 (i.e. 804) in accordance with some embodiments. The reference oscillating signal 804 represents the oscillating signal at the terminal DIV180 when the transistor M13 is absent. At times t9 and t11, the falling edges of the pulse signals in the injection signal INJ may cause the voltages of the oscillating signal 802 to be higher than the middle voltage level Vm. At times t10 and t12, the rising edges of the pulse signals in the injection signal INJ may turn off the transistor M13, and the oscillating signal 802 continues the oscillation with the new phase, which is 180 degree different from the reference oscillating signal 804 when the transistor M13 is absent. It is noted that, in this embodiment, the pulse width Tp of the pulse signal of the injection signal INJ is substantially equal to the period of the oscillating signal 802. However, this is not a limitation of the present invention. In other embodiments, the pulse width Tp of the pulse signal of the injection signal INJ may be smaller than the period of the oscillating signal 802. Therefore, the pulse widths Tp that are not greater than the period of the oscillating signal 802 belong to the scope of the present invention. Accordingly, by using the transistor M13, the pulse signal of the injection signal INJ may adjust the phase of the output oscillating signal 802 to be 180 degree different from the phase of the reference oscillating signal 804.

Figure 9:
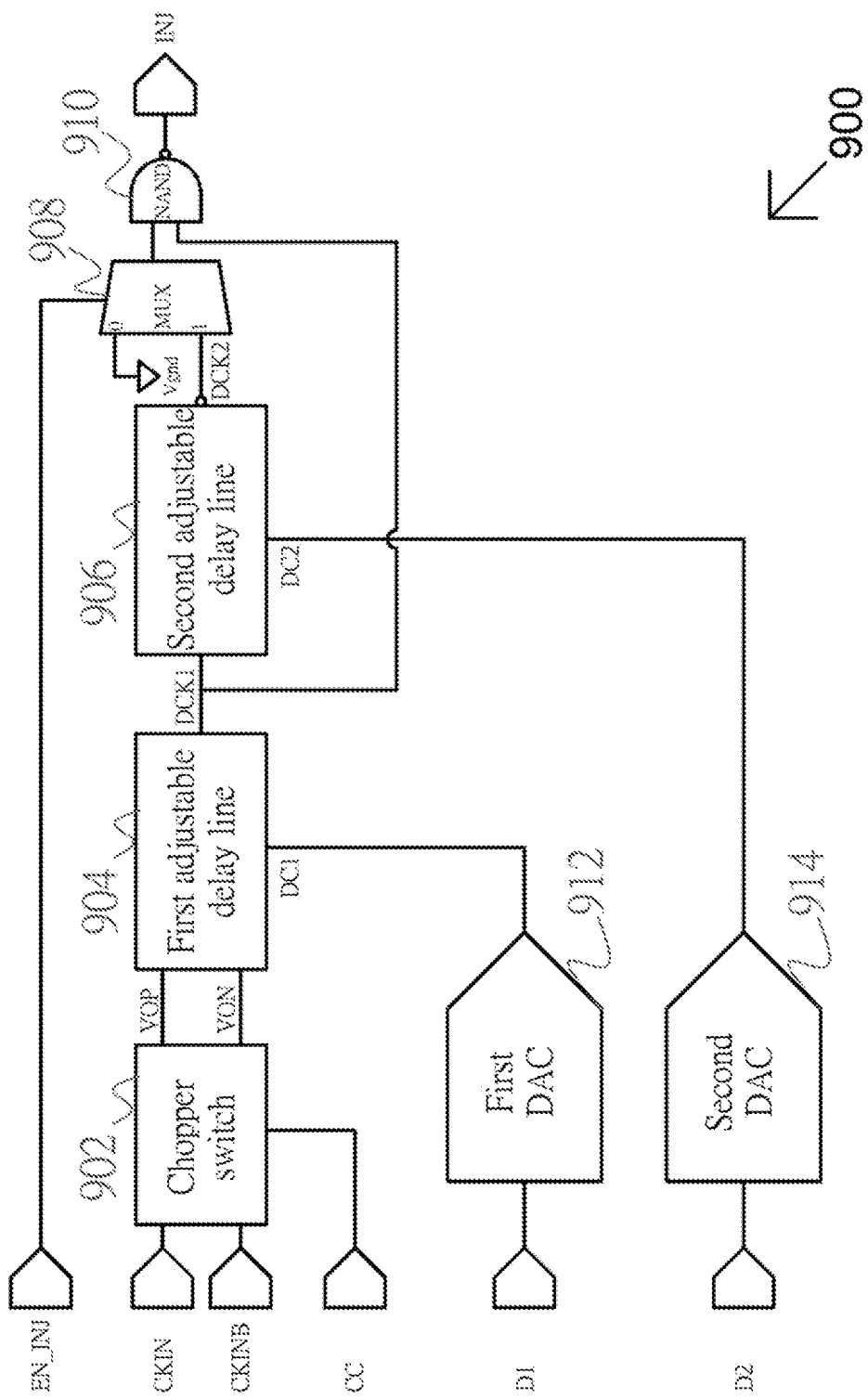
FIG. 9 is a diagram illustrating a signal generating circuit in accordance with some embodiments.

FIG. 9 is a diagram illustrating a signal generating circuit 900 in accordance with some embodiments. The signal generating circuit 900 may be an implementation of the signal generating circuit 204. The signal generating circuit 900 comprises a chopper switch 902, a first adjustable delay line 904, a second adjustable delay line 906, a multiplexer 908, a NAND gate 910, a first digital to analog converter (DAC) 912, and a second DAC 914. In this embodiment, the adjustable delay line 904 and the second adjustable delay line 906 are controlled by analog signals outputted from the first DAC 912 and the second DAC 914 respectively. However, this is not a limitation of the present invention. The adjustable delay line 904 and the second adjustable delay line 906 may be digital-controlled delay lines that may be directly controlled by digital signals. The chopper switch 902 is arranged to output a differential output clock signal VOP, VON according to a differential input clock signal CKIN, CKINB, and a control signal CC. The differential input clock signal CKIN, CKINB may be the above mentioned second retiming oscillating signal Srt2. The first adjustable delay line 904 is coupled to the chopper switch 902 for delaying the differential output clock signal VOP, VON to generate a first delay clock signal DCK1 according to a first delay control signal DC1. The first adjustable delay line 904 may be a coarse adjustable delay line. The second adjustable delay line 906 is coupled to the first adjustable delay line 904 for delaying the first delay control signal DC1 to generate a second delay clock signal DCK2 according to a second delay control signal DC2. The second adjustable delay line 906 may be a fine adjustable delay line. The multiplexer 908 is arranged to output a ground voltage level or the second delay clock signal DCK2 according to an injection enable signal EN_INJ. The NAND gate 910 is coupled to the multiplexer 908 for outputting an injection signal INJ (or Sj in FIG. 3) according to the output of the multiplexer 908 and the first delay clock signal DCK1. The first DAC 912 is coupled to the first adjustable delay line 904 for generating the first delay control signal DC1 according to a first digital signal D1. The second DAC 914 is coupled to the second adjustable delay line 906 for generating the second delay control signal DC2 according to a second digital signal D2. In this embodiment, when the injection enable signal EN_INJ is the high voltage level, the multiplexer 908 outputs the second delay clock signal DCK2 to the NAND gate 910, and the NAND gate 910 outputs the pulse signals. When the injection enable signal EN_INJ is the low voltage level, the multiplexer 908 outputs the ground voltage Vgnd to the NAND gate 910, and the NAND gate 910 outputs the supply voltage Vdd. Accordingly, the period of the injection signal INJ may be similar to the period of the input clock signal CKIN, and the duty cycle of the injection signal INJ (or the pulse width Tp of the pulse signal of the injection signal INJ) may be adjusted or controlled by the delay times of the first adjustable delay line 904 and the second adjustable delay line 906.

Figure 10:
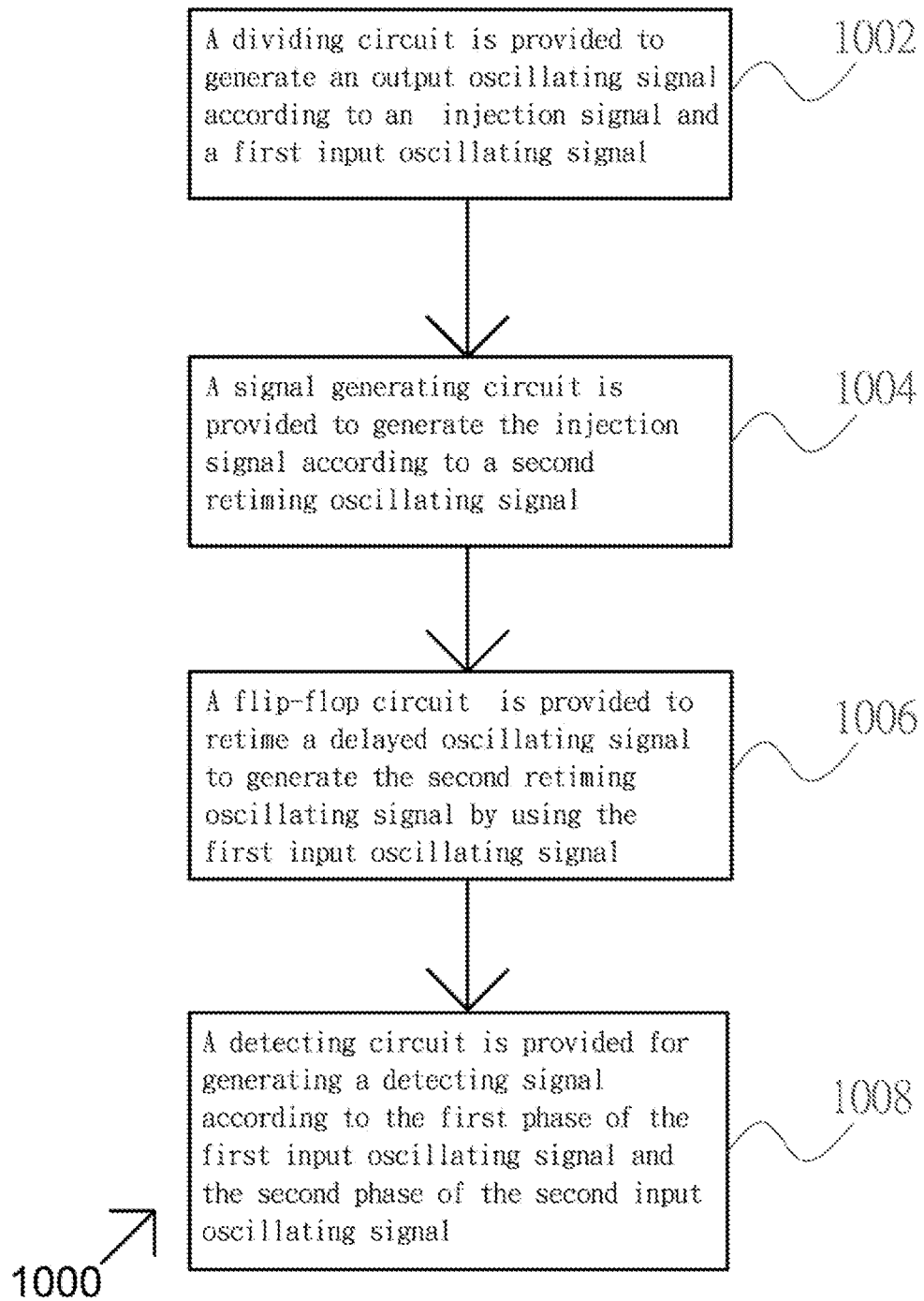
FIG. 10, which is a flowchart illustrating a method for dividing signal in according with some embodiments.

According to some embodiments, the operation of the signal divider 300 may be summarized into the operations as shown in FIG. 10, which is a flowchart illustrating a method 1000 for dividing signal in according with some embodiments. For brevity, the detailed description of the method 1000 is described with the signal divider 300, however this is not a limitation of the present invention. According to some embodiments, the method 1000 comprises operations 1002~1008. Provided that substantially the same result is achieved, the operations of the flowchart shown in FIG. 10 may not follow the same order and may not be contiguous. In some embodiments, other intermediate operations may be included.

In operation 1002, the dividing circuit 202 is provided to generate the output oscillating signal So1 according to the injection signal Sj and the input oscillating signal Si1.

In operation 1004, the signal generating circuit 204 is provided to generate the injection signal Sj according to the second retiming oscillating signal Srt2.

In operation 1006, the flip-flop circuit 302 is provided to retime the delayed oscillating signal Si2d to generate the second retiming oscillating signal Srt2 by using the first input oscillating signal Si1 such that the second retiming oscillating signal Srt2 is synchronous with the input oscillating signal Si1.

In operation 1008, the detecting circuit 206 is provided for generating the detecting signal Sd1 according to the first phase of the input oscillating signal Si1 and the second phase of the input oscillating signal Si2, wherein the detecting signal Sd1 is used for determining if the delayed oscillating signal Si2d is locked to the predetermined phase of the first input oscillating signal Si1. When the delayed oscillating signal Si2d fails to lock or align to the predetermined phase of the first input oscillating signal Si1, the delay time of the adjustable delay circuit 2062 may be adjusted until the phase of the delayed oscillating signal Si2d is locked to the predetermined phase of the first input oscillating signal Si1.

Briefly, according to the above embodiments, the phase of the output oscillating signal(s) used for mixing signals in the first RF device 102 and the phase of the output oscillating signal(s) used for mixing signals in the second RF device 104 may be effectively controlled to be synchronous with each other although the phase of the input oscillating signal received by the first RF device 102 and the phase of the input oscillating signal received by the second RF device 104 are asynchronous. Accordingly, the problem of clock skew in the existing arts may be solved.

According to some embodiments, a signal divider is provided. The signal divider comprises a dividing circuit and a signal generating circuit. The dividing circuit is arranged to generate an output oscillating signal according to a first input oscillating signal. The signal generating circuit is coupled to the dividing circuit, for generating an injection signal to the dividing circuit. The dividing circuit is arranged to generate the output oscillating signal with a predetermined phase according to the injection signal and the first input oscillating signal.

According to some embodiments, a signal distribution system is provided. The distribution system comprises a first signal divider, a second signal divider, a first transmitting channel, and a second transmitting channel. The first signal divider is arranged to generate a first output oscillating signal according to a first input oscillating signal. The second signal divider is arranged to generate a second output oscillating signal according to the first input oscillating signal. The first transmitting channel is coupled to the first signal divider and the second divider for transmitting the first input oscillating signal to the first signal divider and the second signal divider. The second transmitting channel is coupled to the first signal divider and the second divider, for transmitting a second input oscillating signal to the first signal divider and the second signal divider. The first input oscillating signal has a first frequency, the second input oscillating signal has a second frequency, and the second frequency is smaller than the first frequency.

According to some embodiments, a method for dividing signal is provided. The method comprises the steps of: providing a dividing circuit to generate an output oscillating signal according to a first input oscillating signal; and generating an injection signal to the dividing circuit to pull a voltage level of the output oscillating signal to a reference voltage level to generate the output oscillating signal with a predetermined phase.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A signal distribution system, comprising:
    a first signal divider, arranged to generate a first output oscillating signal according to a first input oscillating signal;
    a second signal divider, arranged to generate a second output oscillating signal according to the first input oscillating signal;
    a first transmitting channel, coupled to the first signal divider and the second divider, for transmitting the first input oscillating signal to the first signal divider and the second signal divider; and
    a second transmitting channel, coupled to the first signal divider and the second divider, for transmitting a second input oscillating signal to the first signal divider and the second signal divider;
    wherein the first input oscillating signal has a first frequency, the second input oscillating signal has a second frequency, and the second frequency is smaller than the first frequency.

2. The signal distribution system of claim 1, wherein the first frequency is a multiple of the second frequency.

3. The signal distribution system of claim 1, wherein the first signal divider comprises:
    a first dividing circuit, arranged to generate the first output oscillating signal according to the first input oscillating signal; and
    a first signal generating circuit, coupled to the first dividing circuit, for generating a first injection signal to the first dividing circuit;
    wherein the first dividing circuit is arranged to generate the first output oscillating signal with a first predetermined phase according to the first injection signal.

4. The signal distribution system of claim 3, wherein the first signal generating circuit is arranged to generate the first injection signal according to the second input oscillating signal.

5. The signal distribution system of claim 3, wherein the first injection signal is a pulse signal with a pulse width, and the pulse width is not greater than a period of the first output oscillating signal.

6. The signal distribution system of claim 3, wherein the first injection signal is arranged to pull a voltage level of the first output oscillating signal to a reference voltage level of the first dividing circuit.

7. The signal distribution system of claim 3, further comprising:
    a detecting circuit, coupled to the first dividing circuit and the first signal generating circuit, for generating a detecting signal according to a first phase of the first input oscillating signal and a second phase of the second input oscillating signal.

8. The signal distribution system of claim 7, wherein the first input oscillating signal is oscillated between a first voltage level and a second voltage level, when a voltage level of the detecting signal is a third voltage level, the detecting signal indicates that the second input oscillating signal is locked to the first voltage level of the first input oscillating signal, and when the voltage level of the detecting signal is a fourth voltage level different from the third voltage level, the detecting signal indicates that the second input oscillating signal is locked to the second voltage level of the first input oscillating signal.

9. The signal distribution system of claim 7, wherein the detecting circuit comprises:
    an adjustable delay circuit, coupled to the first signal generating circuit, for delaying the second input oscillating signal by a delay time to generate a delayed oscillating signal;

a first flip-flop circuit, having a data input terminal receiving the first input oscillating signal, a clock input terminal coupled to the adjustable delay circuit for receiving the delayed oscillating signal, and a data output terminal for generating a first retiming oscillating signal; and a low-pass filter, coupled to the data output terminal, for outputting the detecting signal according to the first retiming oscillating signal.

10. The signal distribution system of claim 9, wherein the delay time of the adjustable delay circuit is adjusted according to the detecting signal.

11. The signal distribution system of claim 10, further comprising:

a computing device, coupled to the adjustable delay circuit and the low-pass filter, for automatically generating an optimal delay time for the adjustable delay circuit.

12. The signal distribution system of claim 9, further comprising:

a second flip-flop circuit, having a data input terminal coupled to the adjustable delay circuit for receiving the delayed oscillating signal, a clock input terminal for receiving the first input oscillating signal, and a data output terminal coupled to the first signal generating circuit for generating a second retiming oscillating signal;

wherein the first signal generating circuit is arranged to generate the first injection signal according to the second retiming oscillating signal.

13. The signal distribution system of claim 3, wherein the second signal divider comprises:

a second dividing circuit, arranged to generate the second output oscillating signal according to the first input oscillating signal; and a second signal generating circuit, coupled to the second dividing circuit, for generating a second injection signal to the second dividing circuit;

wherein the second dividing circuit is arranged to generate the second output oscillating signal with a second predetermined phase according to the second injection signal.

14. The signal distribution system of claim 13, wherein the first predetermined phase and the second predetermined phase has a predetermined phase difference.

15. The signal distribution system of claim 13, further comprising:

a detecting circuit, coupled to the second dividing circuit and the second signal generating circuit, for generating a detecting signal according to a first phase of the first input oscillating signal and a second phase of the second input oscillating signal.

16. The signal distribution system of claim 15, wherein the detecting circuit comprises:

an adjustable delay circuit, coupled to the second signal generating circuit, for delaying the second input oscillating signal by a delay time to generate a delayed oscillating signal;

a first flip-flop circuit, having a data input terminal receiving the first input oscillating signal, a clock input terminal coupled to the adjustable delay circuit for receiving the delayed oscillating signal, and a data output terminal for generating a first retiming oscillating signal; and a low-pass filter, coupled to the data output terminal, for outputting the detecting signal according to the first retiming oscillating signal.

17. The signal distribution system of claim 16, further comprising:

a second flip-flop circuit, having a data input terminal coupled to the adjustable delay circuit for receiving the delayed oscillating signal, a clock input terminal for receiving the first input oscillating signal, and a data output terminal coupled to the second signal generating circuit for generating a second retiming oscillating signal;

wherein the second signal generating circuit is arranged to generate the second injection signal according to the second retiming oscillating signal.

18. A phased array radar system, comprising:

a first RF device, the first RF device comprising a first signal divider arranged to generate a first output oscillating signal according to a first input oscillating signal;

a second RF device, the second RF device comprising a second signal divider, arranged to generate a second output oscillating signal according to the first input oscillating signal;

a first transmitting channel, coupled to the first signal divider and the second signal divider, for transmitting the first input oscillating signal to the first signal divider and the second signal divider; and a second transmitting channel, coupled to the first signal divider and the second signal divider, for transmitting a second input oscillating signal to the first signal divider and the second signal divider;

wherein the first input oscillating signal has a first frequency, the second input oscillating signal has a second frequency, and the second frequency is smaller than the first frequency.

19. The phased array radar system of claim 18, wherein the first signal divider comprises:

a first dividing circuit, arranged to generate the first output oscillating signal according to the first input oscillating signal; and a first signal generating circuit, coupled to the first dividing circuit, for generating a first injection signal to the first dividing circuit;

wherein the first dividing circuit is arranged to generate the first output oscillating signal with a first predetermined phase according to the first injection signal.

20. The phased array radar system of claim 19, wherein the second signal divider comprises:

a second dividing circuit, arranged to generate the second output oscillating signal according to the first input oscillating signal; and a second signal generating circuit, coupled to the second dividing circuit, for generating a second injection signal to the second dividing circuit;

wherein the second dividing circuit is arranged to generate the second output oscillating signal with a second predetermined phase according to the second injection signal.

* * * * *